United States Patent [19]

Pang

[11] Patent Number: 5,094,973
[45] Date of Patent: Mar. 10, 1992

[54] TRENCH PILLAR FOR WAFER PROCESSING

[75] Inventor: Harry F. Pang, Houston, Tex.

[73] Assignee: Texas Instrument Incorporated, Dallas, Tex.

[21] Appl. No.: 541,676

[22] Filed: Jun. 21, 1990

Related U.S. Application Data

[63] Continuation of Ser. No. 302,060, Jan. 25, 1989, abandoned, which is a continuation of Ser. No. 123,757, Nov. 23, 1987, abandoned.

[51] Int. Cl.$^5$ .............................. H01L 21/76
[52] U.S. Cl. ...................... 437/67; 357/49; 357/55
[58] Field of Search ............ 437/67; 357/49, 55; 156/643, 644

[56] References Cited

U.S. PATENT DOCUMENTS 4,693,781 9/1987 Leung ........................ 156/643

FOREIGN PATENT DOCUMENTS 136328 7/1985 Japan ........................... 437/67

Primary Examiner—Olik Chaudhuri
Assistant Examiner—Long Pham
Attorney, Agent, or Firm—Melvin Sharp; James T. Comfort; N. Rhys Merrett

[57] ABSTRACT

A T-shaped trench intersection shaped to make uniform the wall-to-wall spacing at the trench intersection and prevent the formation of voids when the trench is filled with a conformal insulating material.

9 Claims, 1 Drawing Sheet

TRENCH PILLAR FOR WAFER PROCESSING

This is a continuation of application Ser. No. 302,060, filed Jan. 25, 1989, which is a continuation of Ser. No. 07/123,757, filed on Nov. 23, 1987, now both abandoned.

TECHNICAL FIELD OF THE INVENTION

The present invention relates in general to the processing of semiconductor wafers, and more particularly relates to trench isolation and a layout technique for improving the quality of such trenches.

BACKGROUND OF THE INVENTION

The fabrication of multiple circuits in a semiconductor substrate often necessitates the electrical isolation between such circuits. A conventional technique for isolating circuits within a semiconductor substrate utilizes reverse-biased PN junctions between the circuits to achieve the electrical isolation thereof. Another approach utilized for isolating circuits comprises the formation of a thick field oxide between the circuits. While both of the noted isolation techniques are effective to isolate the electrical operation of one circuit from the other, both such techniques require substantial lateral wafer area.

The current trend in semiconductor wafer processing and circuit design is to increase the circuit density and thus provide more and more circuits on a single wafer, or chip. As a result, trench isolation techniques have been developed for isolating adjacent circuits, while at the same time reducing the wafer area required for the isolation. Currently, isolation trenches on the order of two microns in width can be formed between adjacent circuits, thereby allowing the lateral wafer area to be better utilized for additional circuits. The use of trenches for isolation is well known, as illustrated in U.S. Pat. Nos. 4,507,849 by Shinozaki, 4,509,249 by Goto et al., 4,528,047 by Beyer et al., and 4,631,803 by Hunter et al.

When employing trench isolation, the circuits to be isolated are generally encircled with a trench which is filled with a dielectric or other insulating material. When a number of adjacent circuits are trench isolated, the circumscribing trenches can appear on the surface of the wafer as a matrix, each having four trench sidewalls common to other isolation trenches, and intersections at the corners thereof. With such a matrix of trenches, a problem arises when the trenches are filled, such as with a conformal insulating material, e.g., an undoped polycrystalline silicon (polysilicon). Because of the conformal deposition of such material, the sidewalls of the trench close in together until the trench is filled. If the width of each of the trenches is uniform, then all the trenches close together at about the same time in the deposition process. On the other hand, since the diagonal spacing between the trench sidewalls is greater at the intersections, such locations do not become completely filled with the insulating material. Hence, voids are formed.

The voids appearing at many of the corners of the trench matrix can collect and trap contaminants which present processing or reliability problems. In addition, metal interconnections which are deposited over such void locations may be formed with an inherent thinned area, thereby reducing the current carrying capability of the conductor. One approach taken to address the voids at the trench corner locations is to over deposit the conformal trench isolation layer so that it is assured that no voids remain. However, this necessitates an extended etching step during planarization of the trench isolation material in order to remove the excess material from the surface of the wafer.

From the foregoing, it can be seen that a need exists for a method of fabricating trenches in semiconductor wafers to eliminate the voids without requiring the excess deposition of the trench isolation material. There is an associated need for providing a voidless trench structure which does not require additional or new process steps.

SUMMARY OF THE INVENTION

In accordance with the present invention, an improved technique for forming isolation trenches is disclosed, which technique reduces or substantially eliminates the disadvantages and shortcomings associated with the prior art trenching techniques. According to the invention, the layout of trenches on a wafer is arranged such that the corners of four adjacent trenches do not meet at an intersection forming a cross, but rather the trenches are formed so that corners of two adjacent trenches join between corners of a third trench, thereby forming a "T" type of intersection. The technical advantage presented by this type of trench layout is that the voids at such a "T" intersection are minimized, or completely eliminated. In accordance with another feature of the invention, the "T" intersection is formed by appropriate patterning which tends to round the two right angles of the "T" intersection and indent the midsection of the upper cross part of the "T" to further reduce the dimensional differences across the trench at the intersection location.

BRIEF DESCRIPTION OF THE DRAWINGS

Further features and advantages will become more apparent from the following and more particular description of the preferred embodiment of the invention, as illustrated in the accompanying drawings in which like reference characters generally refer to the same parts, regions or areas throughout the views, and in which.

DETAILED DESCRIPTION OF THE INVENTION

Figure 1:
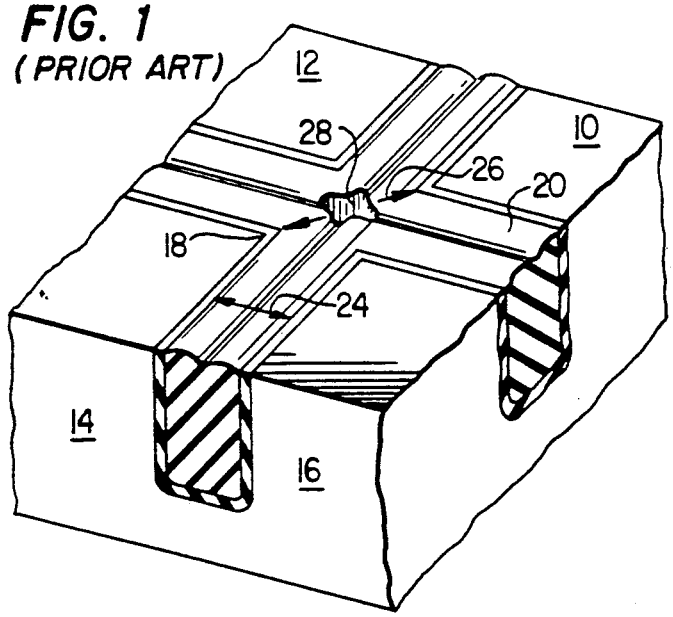
FIG. 1 is a perspective sectional view of a cross-type of trench structure well known in the art.

FIG. 1 illustrates a portion of a wafer having a trench isolation network. Particularly, square or rectangular shaped trenches are typically utilized for isolating semiconductor circuit areas, as identified by reference characters 10-16. The square or rectangular trenches are shown at an intersection 18 forming a cross-shaped structure. The intersection occurs at the junction of one lateral trench 20 with another trench 24. The trenches 20 and 22 extend into the substrate a distance sufficient to electrically isolate the circuit fabricated within the semiconductor circuit areas 10-16.

With high definition mask and patterning techniques, the trenches 20 and 22 can be formed with a width 24 of about two microns. A trench having a two micron width can be filled by depositing therein a conformal layer of insulating material, such as undoped polysilicon, over the surface of the wafer to a depth of about one micron. Thus, when the conformal deposition fills the trench from the sidewalls toward the center, the one micron thick layer meets in the middle of the trench, thus filling it completely. However, the dimension between the intersection corners of diagonally displaced corners, shown by reference character 26, is about 2.8 microns, and thus a one micron layer of insulating material is insufficient to completely fill the trench intersection 18. As a result, a void 28 forms which extends downwardly and approaches the bottom of the trench. As noted above, this void 28 can accumulate contaminants during cleaning steps and thereby present potential reliability problems. In addition, a semiconductor chip or wafer having such voids 28 may not conform with specifications of certain vendors and purchasers.

Figure 2:
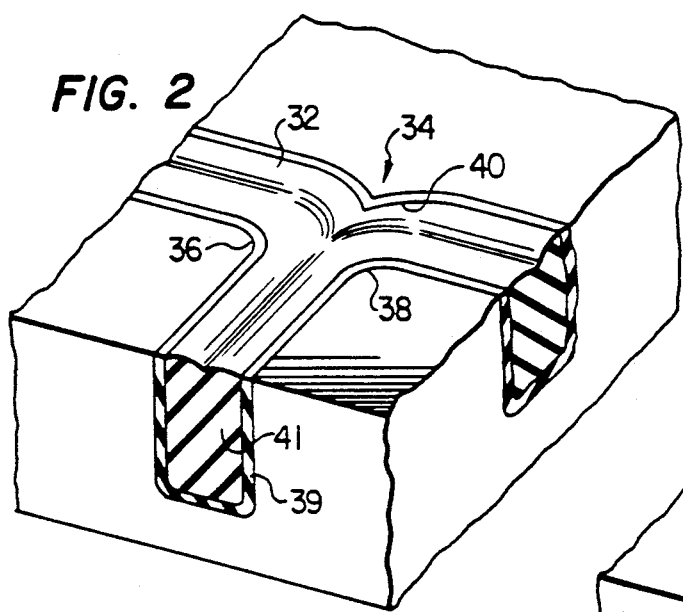
FIG. 2 illustrates a perspective sectional view of a trench layout in accordance with the invention.

In accordance with the preferred embodiment of the invention, a trench structure shown in FIG. 2 has been devised. In the preferred form, the trench matrix does not comprise a pair of trenches which intersection each other forming a cross, but rather defines a structure having a first trench 41 extending within the wafer, and abutting with a second trench 32 such that the intersection 34 forms a "T" shape. In this manner, the various trench dimensions at the intersection 34 deviate substantially less with respect to the width of the elongate part of the trenches, and thereby minimize or eliminate the formation of the intersection voids.

According to the invention, the inside corners 36 and 38 of the trench are angled or curved. The natural flowing of conventional photoresist aids in forming the rounded corners. For computer generated trench masks, a number of small angles can be employed to form a substantially round corner. In like manner, the lateral part of the "T" trench structure includes a concave or cusp 40 which is angled or curved according to the inside corners 36 and 38. With such a structure, the sidewall-to-sidewall dimensions of the trench at the intersection 34 more closely correspond to the trench width, thereby further minimizing or eliminating intersection voids. Indeed, it is envisioned that substantially all trenches on a wafer can be constructed employing the T-intersections, thereby reducing the number of intersection voids.

The trench structure of FIG. 2 can be constructed by conventional techniques. For example, a photoresist can be spun over the surface of the wafer and exposed in a defined pattern to form the T-shape with the rounded corners 36 and 38, and the cusp 40. When exposed, the photoresist is washed by a solution to remove that area which defines the elongate trench opening, as well as all of the T-shape intersections. The wafer can then be etched, using a dry etch, such as an anisotropic reactive ion etch, to remove the silicon wafer material within the mask opening. Masking and patterning techniques are currently available for forming the constant width trench intersections of the invention. The trench is then oxidized to form a silicon oxide layer 39. The trench can thereafter be filled with a conformal coating of undoped polysilicon 41. Conventional planarization steps can be carried out to remove the surface oxide and polysilicon which covers the circuit areas of the wafer.

Figure 3:
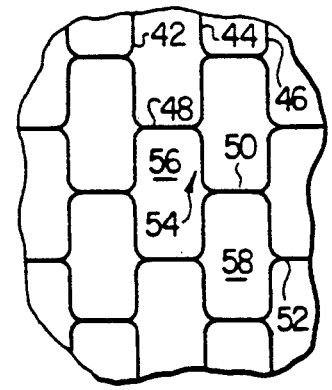
FIG. 3 illustrates a top view of a trench layout according to the invention.

FIG. 3 illustrates an isolation trench matrix utilizing the T-type intersections. As can be seen, a number of vertical trenches 42, 44 and 46 extend in one direction across the wafer. Connecting the trenches 42-46 are other trench segments, such as shown by reference character 48-52 which are staggered so as to form a number of T-shaped intersections, such as identified by reference character 54. As noted, the isolated semiconductor circuit areas 56 and 58 are also staggered so as to eliminate the need for cross-type intersections. Of course, the trenches and semiconductor circuit areas may be shaped differently than shown in FIG. 3, but may yet come within the principles and concepts of the invention.

Figure 4:
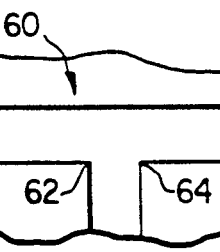
FIG. 4 illustrates an alternative layout of a trench in accordance with the invention.

FIG. 4 illustrates another embodiment of the invention. In this embodiment, the sidewalls of the trenches are all linear shaped, and the inside corners 62 and 64 are square. With the isolation trench intersection shaped with this style of "T", the masking and patterning is simplified, and the minimization of intersection voids is improved over that of the cross-type trench intersections heretofore utilized.

Figure 5:
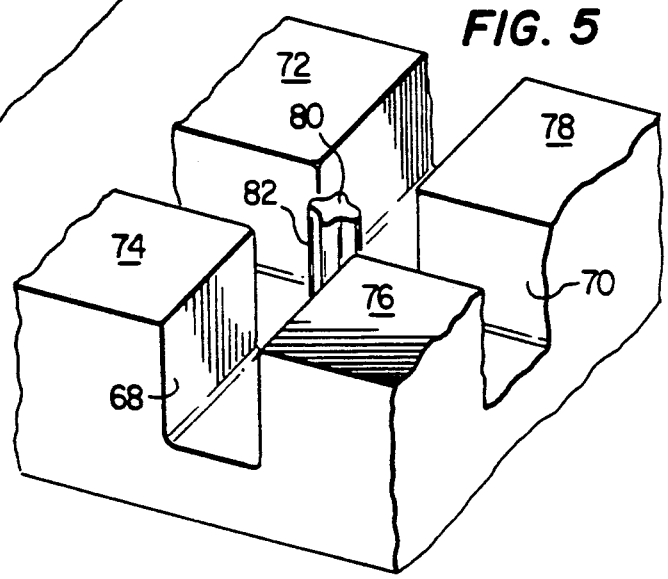
FIG. 5 is a perspective sectional view of an improved cross-type trench intersection.

In accordance with yet another embodiment of the invention, FIG. 5 illustrates a technique for minimizing or eliminating the voids when utilizing the cross-type trench intersections. Depicted in FIG. 5 is a conventional trench intersection 66 formed by a first trench 68 intersecting in an orthogonal manner with a second trench 70. In patterning a photoresist, or other masking material, the silicon circuit areas 72, 74, 76 and 78 are masked, as well as a small area 80 having the same size and location as that normally occupied by a void. When the wafer is etched, the trenches 68 and 70 are formed, and the masked area 80 defines a pillar, 82 of semiconductor material extending from the surface of the wafer to the bottom of the trench intersection 66. Thus, when the trench isolation material is deposited in a conformal manner over the surface of the wafer, the intersection is filled around the pillar 82 and thus the void is eliminated.

From the foregoing, disclosed is an improved trench layout which minimizes or eliminates intersection voids. According to the principles and concepts of the present invention, the trench matrix utilized in a wafer eliminates substantially all cross-type intersections and utilizes in lieu thereof T-type intersections. More importantly, the T-type intersections are shaped so that the wall-to-wall spacing remains essentially constant throughout the matrix. In this manner, the conformal filling of the trench with an isolation material is uniform throughout the trench, as well as the intersection, thereby eliminating intersection voids.

According to another embodiment, the trench is formed with a pillar of material at a location normally occupied by the void so that the conformal filling of such trench is accomplished without the formation of an intersection void. The technical advantage of the latter noted technique is that current cross-type trench masks can be easily modified to produce void free trenches.

Therefore, while the preferred and other embodiments of the invention have been disclosed with reference to several specific structures, it is to be noted that many changes in detail may be made as a matter of engineering choices without departing from the spirit and scope of the invention, as defined by the appended claims.

What is claimed is:

1. A method for forming an isolation trench structure in a semiconductor material, comprising the steps of:
   forming a first trench intersecting with a second trench;
   forming a pillar within said trench intersection to reduce the fillable volume within essentially said trench intersection; and filling said trenches with a conformal insulating material.

2. The method claim 1 further including forming said intersection as a T-shaped trench structure.

3. The method of claim 2, further including forming said intersection with inside corners which are substantially rounded, and forming said T with a cusped trench sidewall which is rounded such that said wall-to-wall spacing of said intersection is uniform.

4. The method of claim 1, further including forming a trench matrix in a semiconductor wafer, and forming said trench matrix with a plurality of said uniform wall-to-wall intersections.

5. The method of claim 1, further including forming a circuit in each said semiconductor area.

6. The method of claim 3 further comprising the step of forming said intersection with inside corners which are substantially rounded.

7. The method of claim 1, further comprising the step of forming said intersection as a crossing intersection.

8. A method for forming an isolation structure in a semiconductor material, comprising the steps of:
   forming a first trench intersecting with a second trench;
   forming a pillar of material centrally within essentially said trench intersection; and
   filling said trenches with a conformal insulating material.

9. The method of claim 8, wherein the wall-to-wall spacing at said intersections is substantially equal to the pillar width of said trenches.

* * * * *